United States Patent [19]

Boyd

[11] 4,130,425

[45] Dec. 19, 1978

[54] SUBTRACTIVE DEVELOPER FOR LITHOGRAPHIC PLATES

[75] Inventor: Timothy M. Boyd, Warminster, Pa.

[73] Assignee: Marcole, Inc., Upper Darby, Pa.

[21] Appl. No.: 755,449

[22] Filed: Dec. 29, 1976

[51] Int. Cl.$^2$ .................... G03C 5/24; G03F 7/02
[52] U.S. Cl. ................................. 96/48 R; 96/33
[58] Field of Search ...................... 96/33, 29 L, 48

[56] References Cited

U.S. PATENT DOCUMENTS

| | | | |
|---|---|---|---|
| 2,865,873 | 12/1958 | Hodgins et al. | 96/33 |
| 3,378,372 | 4/1968 | Vandeputte et al. | 96/29 L |
| 3,383,211 | 5/1968 | Poels et al. | 96/29 L |
| 3,481,740 | 12/1969 | Herrick et al. | 96/33 |
| 3,595,653 | 7/1971 | Steppan et al. | 96/33 |
| 3,615,791 | 10/1971 | Thomas | 96/33 |
| 3,676,125 | 7/1972 | de Haes | 96/29 L |
| 3,698,904 | 10/1972 | Fukui et al. | 96/33 |
| 3,707,373 | 12/1972 | Martinson | 96/35.1 |
| 3,759,850 | 9/1973 | Lehman | 96/33 |
| 3,891,439 | 6/1975 | Katz | 96/33 |

*Primary Examiner*—Mary F. Kelley
*Attorney, Agent, or Firm*—Weiser, Stapler & Spivak

[57] ABSTRACT

An improved subtractive developer for use on lithographic plates is disclosed and claimed. More particularly, a subtractive developer which is comprised of alcohols of lower alkyls in combination of approximately equal parts with a complex mixture of water, ethylene glycol monobutyl ether, surface active synthetic detergent soap, free fatty carboxylic acid, and inorganic phosphate.

4 Claims, No Drawings

SUBTRACTIVE DEVELOPER FOR LITHOGRAPHIC PLATES

BACKGROUND OF THE INVENTION

The present invention relates to an improved subtractive developer for use on lithographic plates and processes for its use in the development thereof. More particularly, a subtractive developer has been invented which is comprised of alcohols of lower alkyls in combination of approximately equal parts with a complex mixture of water, ethylene glycol monobutyl ether, surface active synthetic detergents, free fatty carboxylic acids and inorganic phosphate.

Subtractive developers for the development of lithographic plates have been commercially available. However, long standing problems with the known developer compounds have included: initial delay before developing commences, improperly dissolved and/or unwanted lacquer remaining on the image area of the plates, improper sensitization of the image area, susceptability to the presence of water in or on the developing area, and "salt and pepper" and blind areas on the press.

SUMMARY OF THE INVENTION

It is therefore an object of the present invention to provide an improved composition for the development of lithographic plates.

It is another object of the invention to provide a subtractive developer composition which avoids the initial contact delay normally required in the developing process.

It is another object of the invention to provide a composition which eliminates the possibility of redeposition of lacquer on the image area of the lithographic plate.

It is another object of the invention to provide a composition for developing lithographic plates which is unaffected by the presence of water in the developing area.

It is a further object of the invention to provide a process for the improved developing of lithographic plates wherein the advantageous properties of the composition of the present invention are used.

DETAILED DESCRIPTION OF THE INVENTION

The present invention relates to a chemical composition for use in lithographic plate making. More specifically, its use is in developing presensitized negative working subtractive lithographic plates. The composition when used in developing such plates has a five-fold purpose:

1. Unexposed light sensitive coating is removed from the background area of the plate,
2. Unwanted lacquer remaining on prelacquered plates is removed from the background area of the plate,
3. The exposed or image area of the plate is developed,
4. The background area of the plate is desensitized, that is, so that the background will not accept ink while on the press,
5. The image area of the plate is sensitized so as to accept ink while on the press.

The time efficiency of plate development in commercial use requires that developing of the plate be accomplished with minimum delay. Where, as in the present invention, no initial delay in the time of contact with the plate is required, development can occur in a more useful fashion.

Also, essential to proper printing is the full and complete removal of unwanted lacquer to prevent its redepositing on the image area and resultant interference with later work. The composition of the present invention, it is observed, has the effect of completely dissolving unwanted lacquer during the developing process thereby eliminating the possibility of lacquer redepositing on the image area. The proper sensitization of the image area of the plate requires a greasy film be left thereon to insure proper ink reception when the plate is on the press. The characteristic of leaving such a greasy film has been observed in plate development using the composition of the present invention. Further the characteristic that the presence of water in the developing area does not affect proper development has been observed in use of the composition of the present invention in plate development.

The present invention also relates to the improved process for the development of subtractive lithographic plates which is employed by using the composition which is a part of the same invention. The process consists, in one broad aspect, to administering an amount of the composition of the present invention sufficient to develop a subtractive lithographic plate to a lithographic plate which is in need of development. In the process of action of the compound of the present invention, the first step is removing unexposed light sensitive coating from the background area of the plate. This step is followed by removing all unwanted lacquer from the background area of the plate and then developing the exposed or image area of the plate. Next, desensitizing the background area and sensitizing the image area of the plate then occurrs. In this process it is contemplated that desensitizing the background area is essential so that it will accept water and not ink when on the press, thereby insuring a clean running plate. Concurrently, sensitization of the image area occurs for the purpose of having the image area readily accept ink and not water when on the press so as to produce an image.

The present invention relates to a composition of which a first part is an alcohol of a lower alkyl or a mixture thereof and a second part is an approximately equal proportion in the composition of a complex mixture of water, ethylene glycol monobutyl ether, surface active synthetic detergent, soap free fatty carboxylic acid and inorganic phosphate. The approximate weight percentage of the complex mixture of the second part is as follows:

Water — 73 to 75%
Ethylene glycol monobutyl ether — 15 to 20%
Surface Active Synthetic Detergent — 4 to 5%
Soap — 1 to 2%
Free Fatty Carboxylic Acid — 2 to 3%
Inorganic Phosphate — 4 to 5%

Analytic evaluation of the complex mixture of the second part of the composition has, in summary, led to the findings listed below in Table I. Procedures employed in the analysis of this complex mixture included among others, mixability tests, total solids and ash determinations, liquid-liquid extraction (both on the sample and acidified portions thereof), distillation, soxhlet extractions, column absorption chromotography, atomic absorption and flame emission, infrared spectroscopy, proton nuclear magnetic resonance spectroscopy, emission spectrography and colorimetric and potentiometric titrations.

Determination of total solids and volatiles at 105° C. resulted, on a weight percentage basis, in a yield of non-volatile content (total solids) of 12.6%. Electrometic titration with Karl Fisher reagent resulted in the determination of water content calculated on weight percentage basis as being 73% to 75%. Determination of the organic volatile portion demonstrates it to be constituted of water, and ethylene glycol monobutyl ether. Examination of non-volatile organic and inorganic constituents by emission spectrography showed potassium to be the major component with constituents of sodium and phosphorous also present. Infrared spectrographic analysis of dried solvent salt soxhlet extracts showed the presence of inorganic phosphates, principally tetrasodium pyrophosphates with the possible presence of small amounts of sodium tripolyphosphate. The presence of phosphorous was confirmed by emission spectrographic analysis, atomic absorption and Lassaigne reaction.

Soxhlet extractives (organic soluble portion) were examined by IR and in many instances separated by column absorption chromatography and re-examined. Other fractions were separated by liquid-liquid extraction and also examined by IR. Recorded spectrograms of the separated components gave the following results. Extraction of the complex mixture within n-butanol and chloroform demonstrated the presence of free unsaturated fatty acids in the chloroform soluble portion and alkali soap of a carboxylic acid (probably linoleic and/or ricinoleic) in the alcohol soluble portion. Further, spectroanalysis demonstrated that the product is principally a potassium rather than a sodium soap.

Spectroanalysis of the methanol column eluate of the soxhlet extract were indicative of fatty acid amine condensate derivative (non-ionic surfactant types).

The qualitative findings of this examination are supported by the results of NMR analysis of the chloroform extract of the complex mixture, the ethyl ether extract of its distillate, and the petroleum ether extract thereof as well.

The proton absorbance band observed in the spectrum of the chloroform extract are characteristic of one or more unsaturated fatty acid mixtures which appear to be mostly linoleic acid. The integration values measured in the spectum indicate that another fatty acid group is present whose identity is that of oleic acid. The mole ratio of oleic to linoleic acid has been calculated to be about 2 to 1. Since there was no evidence to indicate the presence of an esterifying group, the fatty acids are assumed to be present as free acids or as metallic salts.

The NMR spectrogram of the ethyl ether extract is found to contain the butyl ether of ethylene glycol as its major component.

The major components of the petroleum ether extract are the fatty acids and butyl ether of ethylene glycol discussed above.

The composition of the present invention may in its preferred forms have constituents in the following proportions:

| | | |
|---|---|---|
| 1. | Alcohols of lower alkyls | 40–50% |
| | Complex mixture of second part | 50–60% |
| | | 100% |
| 2. | Isopropyl | 40–50% |
| | Complex Mixture of second part | 50–60% |
| | | 100% |

The relative proportion of the constituent elements has limitation in commercial usage insofar as the maintenance of safety parameters is concerned, however, such limitations should not be construed and are not intended as limiting the teaching of the present invention.

TABLE I

| Test Performed and/or Component Found | Sample Part A | Sample Part B | Sample Part C | Comments |
|---|---|---|---|---|
| Flash Point (Cleveland Open Cup) | — | — | 90° F | |
| Fire Point (Cleveland Open Cup) | — | — | 93° F | |
| pH at 28° C on Sample as Received | — | 9.75 | 9.70 | |
| pH at 28° C on 1% v/v Sample Solution | — | 8.95 | — | |
| Total Volatiles at 105° C | — | 87.4% | — | |
| Total Solids at 105° C | — | 12.6% | 6.8% | |
| Water (by Karl Fisher) | — | 73.1% | — | |
| Volatile Organics: solvent (by difference between total volatiles and water) | — | 14.3% | — | Ethylene glycol monobutyl ether |
| Inorganic Residue (soxhlet) | — | 3.8% | — | Tetrasodium pyrophosphate |
| Surfactant (nonionic) | — | 4.4% | — | A fatty acid amino condensate derivative type comp. |
| Carboxylic Acids | — | 2.0% | — | Probably, oleic or linoleate acid |
| Soap (carboxylates) | — | 2.4% | | Probably, potassium oleate or linoleate |

| Formula's Constituent | Hypothetical Weight Percent Composition (weight % range) |
|---|---|
| Water | 73 – 75 |
| Ethylene glycol monobutyl ether | 15 – 20 |
| Surfactant (synthetic detergent) | 4 – 5 |
| Soap | 1 – 2 |
| Free fatty acids (carboxylic acids) | 2 – 3 |
| Tetrasodium pyrophosphate | 4 – 5 |

What is claimed is:

1. A composition for developing presensitized negative, subtractive lithographic plates comprising between 40% and 50% of a first part and between 50% and 60% of a second part, said first part comprising alcohols of lower-alkyls and said second part comprising a mixture of water, ethylene glycol monobutyl ether, nonionic surface active synthetic detergent, soap of the group comprising potassium oleate and linoleate, free fatty carboxylic acid of the group comprising oleic and linoleate acid, and inorganic phosphate.

2. The composition of claim 1 wherein the alcohol is isopropyl.

3. The composition of claim 1 wherein the components of said second part mixture are in the weight ratio of water 73% to 75%, ethylene glycol monobutyl ether 15% to 20%, surface active synthetic detergent 4% to 5%, soap 1% to 2%, free fatty carboxylic acid 2% to 3%, and inorganic phosphate 4% to 5%.

4. The composition of claim 3 wherein the inorganic phosphate is tetrasodium pyrophosphate.

* * * * *